(12) United States Patent
White

(10) Patent No.: US 11,446,708 B2
(45) Date of Patent: Sep. 20, 2022

(54) COMPOSITIONS AND METHODS FOR REDUCING INTERACTION BETWEEN ABRASIVE PARTICLES AND A CLEANING BRUSH

(71) Applicant: ENTEGRIS, INC., Billerica, MA (US)

(72) Inventor: Daniela White, Ridgefield, CT (US)

(73) Assignee: ENTEGRIS, INC., Billerica, MA (US)

( * ) Notice: Subject to any disclaimer, the term of this patent is extended or adjusted under 35 U.S.C. 154(b) by 130 days.

(21) Appl. No.: 16/172,139

(22) Filed: Oct. 26, 2018

(65) Prior Publication Data

US 2019/0168265 A1 Jun. 6, 2019

Related U.S. Application Data

(60) Provisional application No. 62/594,139, filed on Dec. 4, 2017.

(51) Int. Cl.
| | | |
|---|---|---|
| *B08B 3/08* | (2006.01) | |
| *B08B 1/00* | (2006.01) | |
| *B08B 1/02* | (2006.01) | |
| *B24B 37/34* | (2012.01) | |
| *C11D 3/30* | (2006.01) | |
| *C11D 3/37* | (2006.01) | |
| *C11D 3/20* | (2006.01) | |
| *C11D 7/34* | (2006.01) | |
| *C11D 7/32* | (2006.01) | |
| *C11D 7/26* | (2006.01) | |

(Continued)

(52) U.S. Cl.
CPC .............. *B08B 1/002* (2013.01); *A46B 13/00* (2013.01); *B08B 1/007* (2013.01); *B08B 1/02* (2013.01); *B08B 3/04* (2013.01); *B08B 3/08* (2013.01); *B24B 37/34* (2013.01); *C11D 3/2086* (2013.01); *C11D 3/30* (2013.01); *C11D 3/3765* (2013.01); *C11D 7/10* (2013.01); *C11D 7/261* (2013.01); *C11D 7/265* (2013.01); *C11D 7/329* (2013.01); *C11D 7/3218* (2013.01); *C11D 7/3245* (2013.01); *C11D 7/3272* (2013.01); *C11D 7/3281* (2013.01); *C11D 7/34* (2013.01); *C11D 11/0047* (2013.01); *H01L 21/67046* (2013.01)

(58) Field of Classification Search
CPC .......... B08B 1/002; B08B 1/007; B08B 3/04; B08B 1/02; B08B 3/08; H01L 21/67046; C11D 7/3218; C11D 7/3272; C11D 7/10; C11D 11/0047; C11D 7/329; C11D 7/261; C11D 7/265; C11D 7/3245; C11D 7/3281; C11D 7/34; C11D 3/2086; C11D 3/3765; C11D 3/30; A46B 13/00; B24B 37/34
See application file for complete search history.

(56) References Cited

U.S. PATENT DOCUMENTS

| | | |
|---|---|---|
| 9,458,415 B2 | 10/2016 | Li et al. |
| 2002/0142584 A1 | 10/2002 | Andreas |

(Continued)

FOREIGN PATENT DOCUMENTS

| | | |
|---|---|---|
| CN | 107208007 A | 9/2017 |
| JP | 59195649 A | 11/1984 |

(Continued)

*Primary Examiner* — Erin F Bergner

(57) ABSTRACT

Described are methods for removing abrasive particles from a polymeric surface, such as from a polymeric surface of a cleaning brush used in a post chemical-mechanical processing cleaning step, as well as related cleaning solutions.

11 Claims, 6 Drawing Sheets

Mechanism of Brush Imprints Formation

(51) Int. Cl.
    *B08B 3/04*     (2006.01)
    *C11D 11/00*     (2006.01)
    *C11D 7/10*     (2006.01)
    *A46B 13/00*     (2006.01)
    *H01L 21/67*     (2006.01)

(56) References Cited

U.S. PATENT DOCUMENTS

| | | | |
|---|---|---|---|
| 2003/0089891 A1* | 5/2003 | Andreas | H01L 21/3212 252/500 |
| 2005/0020463 A1* | 1/2005 | Ikemoto | C11D 1/72 510/175 |
| 2006/0035568 A1 | 2/2006 | Dunn | |
| 2006/0046623 A1* | 3/2006 | Wang | B23H 5/08 451/56 |
| 2009/0239777 A1* | 9/2009 | Angst | C11D 3/0084 510/175 |
| 2009/0286708 A1 | 11/2009 | Murakami et al. | |
| 2009/0291873 A1 | 11/2009 | Tamboli | |
| 2014/0264151 A1 | 9/2014 | Ko | |

FOREIGN PATENT DOCUMENTS

| | | |
|---|---|---|
| JP | 2008147449 A | 6/2008 |
| JP | 2009071165 A | 4/2009 |
| JP | 2009194049 A | 8/2009 |
| JP | 2010021457 A | 1/2010 |
| JP | 2021505720 A | 2/2021 |

\* cited by examiner

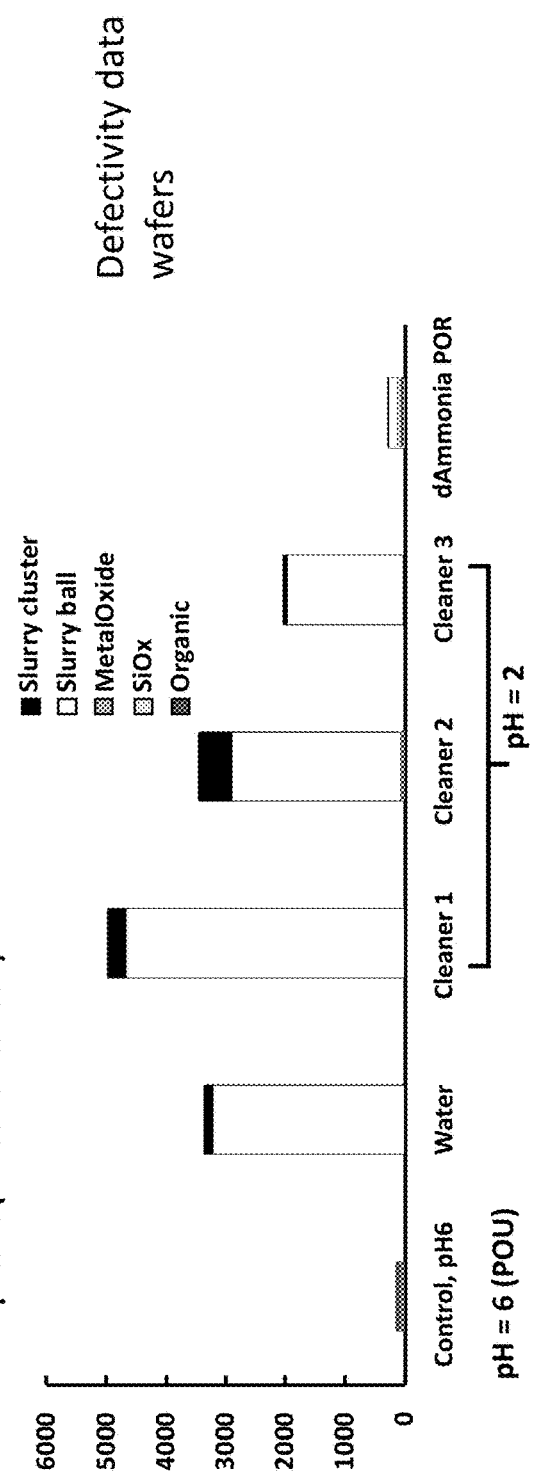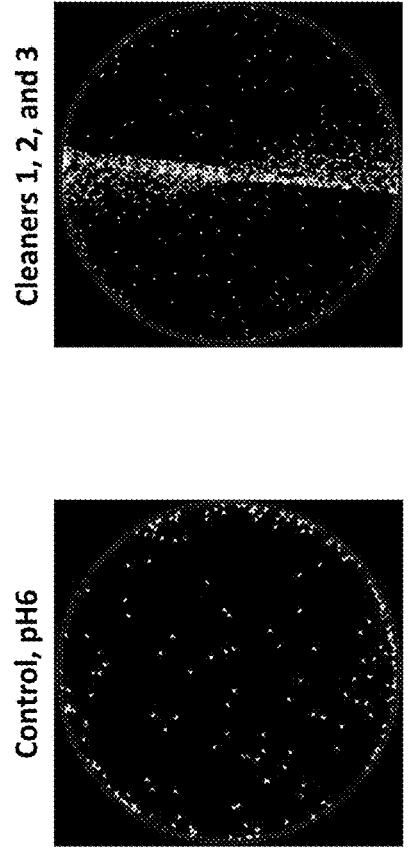
FIG. 1
on PETEOS

FIG. 2 Mechanism of Brush Imprints Formation

Figure 3 FTIR spectrum of silica-loaded poly(vinylformal) brush

Figure 4 FTIR spectra of silica-loaded brushes after cleaning in various cleaners containing the H-bond disruptors

COMPOSITIONS AND METHODS FOR REDUCING INTERACTION BETWEEN ABRASIVE PARTICLES AND A CLEANING BRUSH

CROSS-REFERENCE TO RELATED APPLICATIONS

This application claims the benefit under 35 USC 119 of U.S. Provisional Patent Application No. 62/594,139, filed Dec. 4, 2017, the disclosure of which is hereby incorporated herein by reference in its entirety for all purposes.

FIELD OF THE INVENTION

The invention relates to methods for removing abrasive particles from a polymeric surface, such as from a polymeric surface of a cleaning brush used in a post chemical-mechanical processing cleaning step.

BACKGROUND

In areas of technology that relate to the production (fabrication) of microelectronic devices, which include integrated circuits, optical devices, memory devices, magneto-electric components, and other micro-devices or microdevice components used in electronic, memory, optical, and similar applications, a microelectronic device is prepared by steps that include precisely removing material from a substrate surface. Methods used to prepare certain devices may include a series of steps of depositing and selectively removing different materials at a surface of a substrate. A material applied during processing may be a conductive material such as a metal, a semiconductor material such as a silicon-based material (e.g., silicon oxide), a dielectric layer, or a polymeric material, among others. The materials may be selectively applied and selectively removed, at the surface, in a manner that builds layers of microelectronic structures on the substrate. Removal of material may be done by selective chemical means, by abrasive means, or a combination of these.

In preparing these devices, a processing step that planarizes, flattens, or polishes a substrate surface by abrasive means is commonly used. Between steps of selectively applying and removing materials at a surface, the surface is processed to provide a highly refined (e.g., flat, planarized, or polished) level of finish. The standard technique for such processing is chemical-mechanical processing (CMP). In chemical-mechanical processing, a surface of a substrate is contacted with an abrasive slurry and with a CMP pad, with relative movement between the pad and the surface. The slurry contains liquid carrier (water or organic solvent), dissolved chemicals (i.e., organic chemical materials), and dispersed abrasive particles. (The surface will typically include particulate by-products such as various types of metal oxides, present from previous processing steps.) The combination of the ingredients of the slurry and the movement between the pad and the substrate surface are effective to remove material from the substrate surface and to provide a planarized or polished surface for further processing.

Following a CMP step, various materials that are part of the slurry, as well as materials that have been removed from the substrate surface, remain at the surface of the substrate as chemical or abrasive residue. Chemical residue may be a residual chemical ingredient that is present at the substrate surface after a CMP process, and that is a chemical material present originally in the CMP slurry or a derivative (e.g., reaction product) thereof. Abrasive particle residue refers to abrasive particles that were originally present in the CMP slurry and that remain at the substrate surface at an end of a CMP step. Other types of residue can be a combination of abrasive particles and chemical residue, such as agglomerated, coagulated, or precipitated, organic and abrasive particle materials.

Significant efforts are made during processing of microelectronic devices, e.g., after or between CMP steps, to remove residue from a substrate surface. Residue in the form of residual abrasive particles, in particular, must be removed from a substrate surface because residual abrasive particles can result in surface defects such as scratches, as well as device defects in the form of embedded particles that can have a negative impact on downstream processing of the substrate or on the quality of the downstream product. Methods for removing residue, including residual abrasive particles, include cleaning techniques sometimes referred to as "post-CMP cleaning" techniques, methods, or steps. These involve the use of a cleaning solution applied to a surface of a substrate that includes a residue, along with contact by a moving polymeric brush, to chemically and mechanically remove the residue from the surface.

Many varieties of post-CMP cleaning equipment and cleaning solutions are commercially available. Example apparatus include a cleaning chamber that contains moving brushes along with a system to dispense cleaning solution onto a substrate surface within the cleaning chamber, and to provide motion and contact between the substrate and the brushes. The chamber usually can be heated to facilitate cleaning. In use, the cleaning solution is applied to the substrate surface, and the surface is brought into contact with the moving brushes, to remove residue. While examples of these types of apparatus and methods are known, are commercially useful, and may be capable of efficient and effective post-CMP cleaning of various substrates, there is always a need to improve on existing technologies and to develop new and even more effective cleaning solutions and cleaning methods for removing residue from CMP substrate surfaces.

SUMMARY

The invention relates to methods and composition useful for removing abrasive particles from a polymeric surface, such as from a polymeric surface of a cleaning brush used in a post chemical-mechanical processing cleaning step, as well as related cleaning solutions. The Applicant has determined that abrasive particles, especially those having hydrogen bonding groups at surfaces of the particles, a positive charge (positive zeta potential) in a cleaning solution used in a post-CMP cleaning step, or both, can be attracted to hydrogen bonding groups present at a polymeric surface of a cleaning brush during a post-CMP cleaning step.

During processing of microelectronic devices substrates, prior to a post-CMP cleaning step, a microelectronic device substrate can have residue at its surface, such as residual abrasive particles. During the post-CMP cleaning step those abrasive particles are removed (at least in large part) from the substrate surface and become dispersed in cleaning solution used with the post-CMP cleaning step. While in the cleaning solution, especially at a condition of a low pH (e.g., below 6 or 7), the dispersed abrasive particles can exhibit a positive charge, i.e., a positive zeta potential. Surfaces of the abrasive particles can also include hydrogen bonding groups such as (—OH) groups, e.g., a silanol (—SiOH) in the case of silica particles. The surfaces of the positively charged particles having hydrogen bonding groups thereon are electrostatically attracted to and can form hydrogen bonds with hydrogen bonding groups present at a surface of a polymeric brush used in the post-CMP cleaning step. The abrasive particles can become attracted to and can accumulate at the surface of the polymeric brushes, and can maintain an attraction to the surface by hydrogen bonding, particularly in the presence of a cleaning solution that has a low pH. One potential result of the presence and accumulation of abrasive particles at a surface of a cleaning brush during a post-CMP cleaning step can be the presence of brushmarks following the post-CMP cleaning step.

As used herein, a "hydrogen bonding group," e.g., as a feature of a particle removal agent, a polymeric surface of a brush, or an abrasive particle, is a polar compound or a polar group that is capable of interacting with another hydrogen bonding group to form of hydrogen bond. Examples include a group that includes a hydrogen (H) atom covalently bound to a highly electronegative atom such as nitrogen (N), oxygen (O), sulfur (S), or fluorine (F). Certain specific hydrogen bonding groups include: a carboxylic acid, an amino group, an alcohol, a phosphine, phosphate, phosphonate, an alkanolamine, a carbamide, a urea, urethane, an ester, a betaine, a silanol group, or a sulfur-containing group.

According to presently-described cleaning solutions and methods of their use, a cleaning solution includes a dissolved chemical ingredient, referred to as a particle removal agent, that is effective to prevent the formation of hydrogen bonds between positively-charged abrasive particles in a cleaning slurry and a polymeric brush surface, during a post-CMP cleaning step; to inhibit or reduce the formation of hydrogen bonds between such abrasive particles and a polymeric brush surface during a post-CMP cleaning step; or to remove such abrasive particles that are attracted to and have formed hydrogen bonds with a surface of a polymeric brush (either during a post-CMP cleaning step, or in a separate step of cleaning the brushes in the absence of a substrate).

In one aspect the invention relates to a method of removing abrasive particles from a post-chemical-mechanical-processing (post-CMP) cleaning brush. The method includes: providing a post-CMP cleaning brush having a polymeric surface and having abrasive particle residue at the polymeric surface; and providing a cleaning solution having a pH below 7. The cleaning solution contains: cleaning agent, and particle removal agent. The method also includes removing abrasive particle residue from the polymeric surface by contacting the polymeric surface with the cleaning solution.

In another aspect the invention relates to a method of post-chemical-mechanical-processing (post-CMP) cleaning of a substrate. The method includes: providing a post-CMP cleaning brush having a polymeric surface; and providing a cleaning solution that includes: cleaning agent, and particle removal agent. The method also includes providing a substrate that includes a surface, with residue at the substrate surface, the residue including abrasive particles, and removing residue from the substrate surface by exposing the substrate surface and the polymeric surface to the cleaning solution while contacting the substrate surface with the polymeric surface and while moving the substrate surface relative to the polymeric surface.

In another aspect the invention relates to a cleaning solution concentrate useful for cleaning a substrate in a post-chemical-mechanical processing step. The cleaning solution concentrate includes cleaning agent, and at least 0.1 weight percent particle removal agent that includes a hydrogen bonding group.

SUMMARY OF THE FIGURES

FIG. 1 shows performance data of wafers cleaned with specifically descried methods and materials.

DETAILED DESCRIPTION

Figure 2:
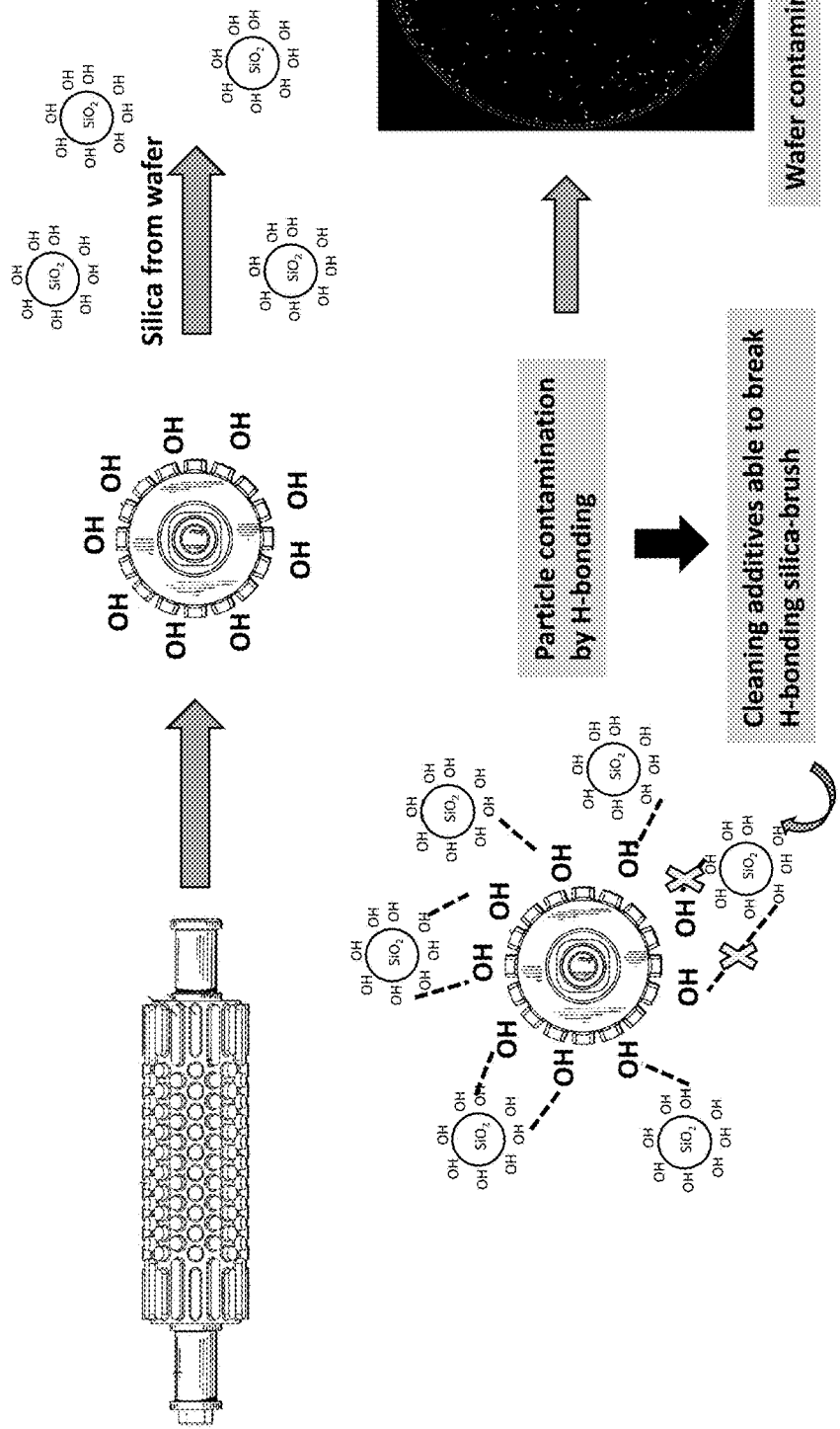
FIG. 2 shows a proposed mechanism of brush imprint formation.

The present description relates, in different aspects, to: methods of removing abrasive particles from a surface of a cleaning brush used in a post-CMP cleaning step (the method being incorporated into a post-CMP cleaning process, or being a separate process or step that removes abrasive particle from the brush); methods of preventing accumulation of abrasive particles from surfaces of a cleaning brush during a post-CMP cleaning process for removing residue from a substrate surface; and to cleaning solutions effective in these methods, wherein the cleaning solution contains particle removal agent.

During chemical-mechanical processing, i.e., CMP or "CMP processing," a substrate is processed to planarize or polish a surface of the substrate by controlled removal of minute amounts of material from the surface. The microelectronic device substrate, i.e., "substrate" for short, can be any type of microelectronic device or a precursor thereof, meaning a device or precursor that is or contains any of an integrated circuit, optical device, solid state memory device, hard disk memory device, magneto-electric component, or another type of microdevice or microdevice component that is useful in an electronic, memory, optical, or similar application and that is prepared by a fabrication process that includes one or more steps of chemical-mechanical-processing a surface of the substrate, often with multiple steps of depositing and selectively removing combinations of materials at the surface of a substrate.

A substrate for use in methods as described can include any material or combination of materials, at a surface, that are part of an in-process microelectronic device, including: semiconducting materials (e.g., silicon), ceramics (e.g., silicon carbide, silicon nitride), glass materials, electrically conductive materials (e.g., metals and metal alloys), electrically insulating (dielectric) materials, barrier materials, and the like. Electrically conductive materials may be metals or alloys of metals that include copper, tungsten, silver, aluminum, and cobalt, as well as others and alloys thereof. Electrically insulating dielectric materials may be any of a variety of presently-known or to-be-developed insulating, low-k, or ultra-low-k dielectric materials including various forms of doped or porous silicon dioxide, thermal oxide, TEOS, to name a few examples. Examples of materials of a substrate that may be present as a barrier layer include: tantalum, tantalum nitride, titanium nitride, cobalt, nickel, manganese, ruthenium, ruthenium-nitride, ruthenium-carbide, or ruthenium tungsten nitride.

A CMP process involves applying a slurry to a surface of the substrate and contacting the slurry and the substrate with a pad (i.e., a "CMP pad" or a "CMP polishing pad"), with movement between the pad and the surface. The slurry contains abrasive particles designed to cause frictional (mechanical) removal of material from the surface of the substrate. The slurry will typically also contain various chemical ingredients dissolved therein that can be effective to control (increase or decrease) the rate of removal of certain materials from the substrate surface; to provide desired selectivity of removal of different materials; to reduce the presence of defects and the amount of residue at the substrate surface during and after the CMP step; or to otherwise facilitate an improved or desired result relating to the efficiency of the CMP process or the quality of the substrate at the end of the CMP process.

Example slurries ("CMP slurries") include liquid carrier that can be mostly water (preferably, deionized water) in which the chemical materials and abrasive particles are dissolved or dispersed. The chemical materials of the slurry can be selected to achieve desired removal rates, selectivity of removal, and final topography (e.g., smoothness, waviness, etc.) of the finished substrate surface. The specific types and amounts of chemical materials in a particular slurry can depend on various factors, such as the type or types of materials present at the substrate surface, CMP processing conditions, the type of CMP pad used in the CMP step, the type or types of abrasive particles of the slurry, etc. Example chemical ingredients include chemical materials such as those that can function as a solvent, surfactant, catalyst, stabilizer, oxidizer, organic inhibitor (to control a removal rate), chelating agent, among others. Other possible chemical materials include pH adjusting agents (base, acid), a corrosion inhibitor, and biocide (as a preservative).

The abrasive particles can have size and composition features to effect the efficient, optionally selective, and uniform removal of specific materials from the substrate surface. Example abrasive particles may be made of or contain alumina, ceria, ceria oxide, zirconium, zirconium oxide, silica (various forms), titanium dioxide, zirconia, diamonds, silicon carbide, or other metal, ceramic, or metal oxide materials. Various sizes, size distributions, particle shapes, and other physical or mechanical properties of these types of abrasive particles are available and can be selected for use with various substrates or CMP processes. An amount of abrasive particles in a slurry can also be selected based on similar factors relating to the type of substrate being processed and features of the CMP process.

For use in processing different types of substrates, the abrasive particles may be selected to exhibit an electrostatic charge, which may be positive or negative, when the particles are dispersed in the CMP slurry. The strength of a charge of a dispersed abrasive particle is commonly referred to as the "zeta potential" (or the electrokinetic potential) of the particle, which refers to the electrical potential difference between the electrical charge of the ions surrounding the particle and the electrical charge of the bulk liquid of the slurry (e.g., the liquid carrier and any other components dissolved therein). The zeta potential of a dispersed particle is typically dependent on the pH of the liquid medium within which the particle is dispersed. For a given slurry or other liquid medium, the pH at which the zeta potential of a charged abrasive particle is zero is referred to as the isoelectric point. As the pH of a solution that contains the dispersed abrasive particles is increased or decreased away from the isoelectric point, the surface charge (and hence the zeta potential) is correspondingly decreased or increased (to more highly negative or more highly positive zeta potential values).

During steps of CMP processing, various materials are present in the slurry, including the dissolved and dispersed (e.g., suspended) ingredients of the slurry, as well as other dissolved or dispersed materials that are generated during the CMP process, such as by being removed from the substrate surface. Additionally present may be derivatives, reaction products, agglomerates, coagulates, and precipitates of any of these. Any such material present in the slurry during a CMP processing step can potentially become a residue that remains at a surface of the substrate at the end of the CMP processing step. Thus, residue at a substrate surface after a CMP step might include: dissolved chemical material or solid abrasive particles that are originally present in a CMP slurry; materials that become removed from a substrate surface during processing (e.g., a metal ion) or that are generated during processing by reaction or chemical modification (e.g., oxidization or reduction) of a chemical material of the slurry; or combinations of these, including precipitates, agglomerates, and coagulates.

As is known generally, various post-CMP cleaning steps are useful for removing residues that are present on a surface of a microelectronic device following a CMP processing step. These cleaning steps can and generally do involve the use of specialized post-CMP cleaning equipment, which may include a cleaning apparatus that includes a cleaning chamber wherein a cleaning solution is delivered to a surface of a substrate, in combination with the application of moving polymeric brushes to the surface to mechanically remove the residue from the substrate surface. The conditions and cleaning time (meaning the amount of time the substrate surface is exposed to the moving brush and the cleaning solution) can be selected based on factors such as the type of substrate, the type of brushes, the types and amounts of residue at the surface, the type of cleaning solution, etc.

A variety of post-CMP cleaning tools that involve the use of polymeric brushes are known and are commercially available. These apparatus generally include a cleaning chamber that includes a moveable cleaning brush (typically multiple cleaning brushes); a source of cleaning solution; a source of heat; and systems, mechanism, devices, including a control system, adapted to place the cleaning solution in contact with the substrate, cleaning solution, and moving brushes, at conditions (time and temperature) effective to cause mechanical removal of residue from the surface. Companies that sell this type of equipment include: Entegris, Inc.; AION; Ceiba Technologies, Inc.; Rippey Corp.; Applied Materials; Ebarra, among others.

A polymeric cleaning brush for use in a post-CMP cleaning apparatus and method according to the present description includes a polymeric surface that contains hydrogen bonding groups, e.g., hydroxy groups (—OH) attached to a polymeric backbone. Cleaning brushes that include a polymeric surface and that are useful in post-CMP cleaning processes are well known. Examples of cleaning brushes that contain a polymeric surface having hydroxy groups attached to a polymeric backbone include brushes made of polymer that is derived, at least in part, from vinyl alcohol, i.e., polymer that is either a homopolymer or copolymer of vinyl alcohol, such polymers (co-polymers and homopolymers) commonly referred to as polyvinylalcohol (a.k.a. "PVOH" or "PVA").

Examples of cleaning brushes used in post-CMP cleaning steps are described, for example, in United States patent application 20013/0048018, the entirety of which is incorporated herein by reference. As described therein, a cleaning brush may be prepared by use of polyvinyl alcohol as a starting material, which may be then processed to form a polyvinyl acetal elastic material. The polyvinyl alcohol starting material may be processed with an aldehyde, e.g., formaldehyde, to produce a polyvinyl alcohol brush material. Other polymers, either instead of or in addition to polyvinyl alcohol, may be useful as polymeric materials for a brush and may include hydrogen bonding groups. Examples of such other polymers include polymeric and co-polymeric nylon, polyurethane, and combinations of these, which can be formed into a cleaning brush suitable for cleaning residue from a substrate as described herein, in a commercial post-CMP cleaning process.

Example brushes include a cylindrical polymeric (as described) foam brush with a first end and a second end, and an outer surface with a plurality of nodules extending from a base surface of the brush. The nodules are located along the length of the brush, between the first and second ends, and are separated from each other by gaps or openings. The nodules may have any shape and often include a circular top surface and a surface height that extends from a base of the brush to the top surface of the nodule. When the brush is rotated about an axis extending between the first and second ends, the outer cylindrical surface of the brush rotates, as do the nodules on the surface. A surface of the substrate, having cleaning solution applied thereto, can be brought into contact with the moving surface of the brush and the brush nodules to allow the nodules to contact the surface to facilitate removal of residue from the surface.

The timing and conditions of the cleaning process should be effective to remove a large portion of a total amount of residue (e.g., as measured by abrasive particle residue) from the substrate surface, in an efficient manner. For example, by use of a typical post-CMP cleaning apparatus and method, a cleaning solution may be contacted with the substrate surface, and the surface will be contacted with the polymeric brushes (with movement between the substrate surface and the brushes) for a time sufficient to remove a high percentage of residue (e.g., abrasive particle residue) present at the surface before the cleaning step. Desirably, a useful post-CMP cleaning step can result in removal of at least 85 percent of the residue (e.g., abrasive particle residue) present on the substrate surface prior to residue removal, more preferably at least 90 percent, even more preferably at least 95 percent, and most preferred at least 99 percent. Methods and equipment useful to measure an amount of residue (e.g., particle residue) remaining at a surface of a substrate are well known and are commercially available.

To achieve such a level of residue removal, example cleaning times of the substrate by the cleaning apparatus may be in a range from about 1 second to about 20 minutes, preferably about 5 seconds to 10 minutes, e.g., in a range from about 15 seconds to about 5 minutes, at temperature in a range of from about 20 degrees Celsius to about 90 degrees Celsius, preferably about 20 to about 50 degrees Celsius. Processing times in these ranges of time and temperature are illustrative, and any other suitable time and temperature conditions may be used if effective to at least partially clean post-CMP residue from a surface of a substrate.

According to the present invention, the Applicant has now specifically identified that abrasive particles, especially those having hydrogen bonding groups at surfaces of the particles, a positive charge (positive zeta potential) in a cleaning solution used in a post-CMP cleaning step, or both, can be attracted to hydrogen bonding groups present at a polymeric surface of a cleaning brush during a post-CMP cleaning step.

Before a post-CMP cleaning step, a microelectronic device substrate can have abrasive particle residue at its surface. During the cleaning step those abrasive particles are removed (at least in large part) from the substrate surface and become dispersed in cleaning solution used with the post-CMP cleaning step. While in the cleaning solution, especially at a condition of a low pH (e.g., below 6 or 7), the dispersed abrasive particles can exhibit a positive charge, i.e., a positive zeta potential. Surfaces of the abrasive particles can also include hydrogen bonding groups such as (—OH) groups, e.g., a silanol (—SiOH) in the case of silica particles. The surfaces of the positively charged particles having hydrogen bonding groups thereon are electrostatically attracted to and can form hydrogen bonds with hydrogen bonding groups present at a surface of a polymeric brush used in the post-CMP cleaning step. The abrasive particles can become attracted to and can accumulate at the surface of the polymeric brushes, and can maintain an attraction to the surface by hydrogen bonding, particularly in the presence of a cleaning solution that has a low pH.

One potential result of the presence and accumulation of abrasive particles at a surface of a cleaning brush during a post-CMP cleaning step can be the presence of brushmarks following the post-CMP cleaning step. Brushmarks (or "brush imprints") are a visible pattern of residual abrasive particles that are present on a substrate surface after a post-CMP cleaning step. The pattern can include a shape or feature (e.g., dimension) that matches a shape or feature of a surface of a cleaning brush used to clean the substrate surface, such as a circular surface of a cleaning brush nodule. Examples of brushmark patterns formed by residual abrasive particles include circular marks that match a shape and size of a nodule, as well as a line pattern that is a distinct line formed from residual abrasive particles, with the length of the line corresponding to a diameter of a circular brush nodule. The brushmarks can be made of and formed by a pattern of abrasive particles (i.e., abrasive particle residue) that remain on the substrate after a step of post-CMP cleaning. A preferred post-CMP cleaning process of the present description can result in a reduced or minimized occurrence of, or preferably an absence of, brushmarks at a surface of a substrate after the post-CMP cleaning step.

According to example methods of the invention, a post-CMP cleaning step involves an apparatus that includes a scrub brush that has a polymeric surface that contains hydrogen bonding groups. Additionally, the cleaning solution used in the cleaning step can have a low pH, such as below about 7, e.g., in a range from about 1 up to about 5 or 6, or from about 1 or 2 up to about 3, 3.5 or 4. These factors can result in the presence of positively-charged abrasive particles (having hydrogen bonding groups) in the cleaning solution during a post-CMP cleaning step, with the positively-charged abrasive particles becoming attracted to hydrogen bonding groups at the brush surface, causing the positively-charged abrasive particles to be attracted to the polymeric brush surface by hydrogen bonding.

According to Applicant's novel and inventive cleaning solutions and methods of their use, a cleaning solution includes a dissolved chemical ingredient, referred to as a particle removal agent, that is effective: to prevent the formation of hydrogen bonds between positively-charged abrasive particles in a cleaning slurry and a polymeric brush surface, during a post-CMP cleaning step; to inhibit or reduce the formation of hydrogen bonds between such abrasive particles and a polymeric brush surface during a post-CMP cleaning step; or to remove such abrasive particles that are attracted to and have formed hydrogen bonds with a surface of a polymeric brush (either during a post-CMP cleaning step, or in a separate step of cleaning the brushes in the absence of a substrate).

Accordingly a cleaning solution of the present description includes or is in the form of a solution that includes an aqueous medium (preferably deionized water) that contains dissolved ingredients that include: particle removal agent, optionally one or more ingredients that function as cleaning agents (e.g., chelating agent, organic solvent); and optionally a small or minor amount of other optional adjuvants such as acid, surfactant, biocide, etc.

A particle removal agent is a chemical compound (including oligomers or polymers) that includes at least one hydrogen bonding group, and that when present in a cleaning solution as described, and in the presence of positively-charged abrasive particles and a polymeric surface of a cleaning brush, can be effective to associate with: a hydrogen bonding group of a polymeric brush surface, a hydrogen bonding group of a positively-charged abrasive particle, or both, in a manner and a degree to which the particle removal agent will reduce the amount of abrasive particles that are present at a surface of a cleaning brush and attracted to the surface of the cleaning brush by hydrogen bonding.

In a cleaning solution that contains dispersed abrasive particles (brought there as residue on a substrate surface) that are positively-charged, e.g., at low pH, particle removal agent can associate with hydrogen bonding groups of the positively-charged particles in a manner that inhibits or prevents the positively-charged particles from becoming attracted to hydrogen bonding groups present at a surface of a polymeric cleaning brush. Additionally, in the presence of a cleaning brush that includes hydrogen bonding groups, and at low pH, particle removal agent can also become associated with hydrogen bonding groups that are present at the surface of the cleaning brush in a manner to inhibit or prevent the cleaning brush from attracting positively-charged abrasive particles that are present in the cleaning solution. Considered more generally, the particle removal agent can prevent or disrupt hydrogen bonds between a positively charged abrasive particle that includes hydrogen bonding groups, and a polymeric surface of a cleaning brush that contains hydrogen bonding groups. These effects and interactions (alone or in combination) between the particle removal agent and the cleaning brush surface, and the particle removal agent and the positively-charged abrasive particles, all present in a cleaning solution (e.g., during a post-CMP cleaning step), effectively reduce the amount of interactions between hydrogen bonding groups of the cleaning brush surface and hydrogen bonding groups of the positively-charged abrasive particles. A result can be that fewer of the abrasive particles will be present at the surface of the cleaning brush and associated with surface by hydrogen bonding.

Accordingly, a cleaning solution of the present invention includes an amount of particle removal agent, the amount and type being effective to reduce the amount (e.g., concentration) of positively-charged abrasive particles present at a polymeric surface of a cleaning brush when the cleaning solution is exposed to the cleaning brush in the presence of such abrasive particles, and at a low pH.

Examples of ingredients that may be useful as a particle removal agent as described include organic compounds, polymers, oligomers, etc., that contain one or more hydrogen bonding groups (when present in the cleaning solution and at a low pH), and that can be included in a cleaning solution to be effective in reducing the presence of positively-charged abrasive particles at a surface of a polymeric cleaning brush, as described. Example compounds generally include nitrogen-containing compounds; amino acids; mono, di or multi-carboxylate-containing groups; alcohols (e.g., polyols); acids; among others.

Some specific examples of particle removal agents include non-ionic, anionic, cationic, and zwitterionic small molecules and polymers that may behave as a polyelectrolyte at neutral pH. Anionic polymers or anionic polyelectrolytes can be natural, modified natural polymers, or synthetic polymers. Exemplary natural and modified natural anionic polymers that can be included in a cleaning solution as described include, but are not limited to: alginic acid (or salts), carboxymethylcellulose, dextran sulfate, poly(galacturonic acid), and salts thereof. Exemplary synthetic anionic polyelectrolytes include, but are not limited to: homopolymers or copolymers of (meth)acrylic acid (or salts), poly(acrylic acid), maleic acid (or anhydride), styrene sulfonic acid (or salts), vinyl sulfonic acid (or salts), allyl sulfonic acid (or salts), acrylamidopropyl sulfonic acid (or salts), and the like, wherein the salts of the carboxylic acid and sulfonic acids are preferably neutralized with an ammonium or alkylammonium cation. Preferred cations of a polyelectrolyte anionic polymer are ammonium cations ($NH_4^+$), cholinium $^+N(CH_3)_3(CH_2CH_2OH)$ and $^+N(CH_3)_4$. Thus, examples of preferred combined synthetic and natural polyelectrolyte anionic polymers are homopolymers or copolymers of (meth)acrylic acid, maleic acid (or anhydride), styrene sulfonic acid, vinyl sulfonic acid, allyl sulfonic acid, vinylphosphonic acid, acrylamidopropyl sulfonic acid, alginic acid, carboxymethylcellulose, dextran sulfate, poly(galacturonic acid), and salts thereof.

Cationic polymers and cationic polyelectrolytes can be natural, modified natural polymers, or synthetic polymers. Exemplary natural and modified natural cationic polymers include, but are not limited to: chitosan, cationic starch, polylysine, and salts thereof. Exemplary cationic synthetic polyelectrolytes include but are not limited to: homopolymers or copolymers of diallyldimethyl ammonium chloride (DADMAC), diallyldimethyl ammonium bromide, diallyldimethyl ammonium sulfate, diallyldimethyl ammonium phosphates, dimethallyldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid addition salts and quaternary salts, diethylaminoethyl (meth)acrylate acid addition salts and quaternary salts, 7-amino-3,7-dimethyloctyl (meth) acrylate acid addition salts and quaternary salts, N,N'-dimethylaminopropyl acrylamide acid addition salts and quaternized salts, wherein the quaternary salts include alkyl and benzyl quaternized salts; allylamine, diallylamine, vinylamine (obtained by hydrolysis of vinyl alkylamide polymers), vinyl pyridine, chitosan, cationic starch, polylysine, and salts thereof.

Other examples include 2-pyrrolidinone, 1-(2-hydroxyethyl)-2-pyrrolidinone (HEP), glycerol, 1,4-butanediol, tetramethylene sulfone (sulfolane), dimethyl sulfone, ethylene glycol, propylene glycol, dipropylene glycol, tetraglyme, diglyme, a glycol ether (e.g., diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (DEGBE), triethylene glycol monobutyl ether (TEGBE), ethylene glycol monohexyl ether (EGHE), diethylene glycol monohexyl ether (DEGHE), ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether (DOWANOL PnB), dipropylene glycol n-butyl ether, tripropylene glycol n-butyl ether, propylene glycol phenyl ether (DOWANOL PPh)), n-ethylpyrrolidone, n-methylpyrrolidone, dimethylformamide, dimethylsulfoxide, ethylene glycol monohexyl ether, diethylene glycol monohexyl ether and combinations thereof. Alternatively, or in addition to, the cleaning additive can include hydroxypropylcellulose, hydroxyethylcellulose, hydroxyethylmethyl cellulose, hydroxyproplymethyl cellulose, carboxymethylcellulose. sodium carboxymethylcellulose (Na CMC), polyvinylpyrrolidone (PVP), any polymer made using the N-vinyl pyrrolidone monomer, polyacrylic acid esters and analogoues of polyacrylic acid esters, polyaminoacids (e.g., polyalanine, polyleucine, polyglycine), polyamidohydroxyurethanes, polylactones, polyacrylamide, Xanthan gum, chitosan, polyethylene oxide, polyvinyl alcohol (PVA), polyvinyl acetate, polyacrylic acid, polyethyleneimine (PEI), sugar alcohols such as sorbitol, sucrose, fructose, lactose, galactose, maltose, erythritol, maltitol, threitol, arabinol, ribitol, mannitol, galactitol, inositol, and xylitol, esters of anhydrosorbitols, secondary alcohol ethoxylates such as TERGITOL, multifunctional alcohols including pentaerytritol, dipentaerythitol, trimethylolpropane, dimethylpropionic acid, and xylonic acid, nucleopbases such as uracil, cytosine, guanine, thymine, and combinations thereof.

Still other examples include lactic acid, maleic acid, urea, glycolic acid, sorbitol, borax (i.e., sodium borate), proline, a betaine, glycine, histidine, TRIS (tris(hydroxymethyl) aminomethane), dimethyl sulfoxide, sulfolane, glycerol, SDS (sodium dodecyl sulfate), dodecylphosphonic acid, or a combination thereof. Of these, certain particle removal agents may be preferred for use in post-CMP cleaning steps for microelectronic device substrates, e.g.: maleic acid, borax (i.e., sodium borate), dimethyl sulfoxide, glycerol, or a combination thereof.

According to certain example cleaning solutions, a total amount of one or more particle removal agents in a cleaning solution at a point of use (during a post-CMP cleaning process) can be at least about 0.01 weight percent, more preferably at least about 0.02 weight percent, such as at least 0.05 weight percent, based on the total weight of the cleaning solution. Example amounts can be up to about 1 weight percent, more preferably up to about 0.3 weight percent, e.g., up to about 0.2 weight percent particle removal agent based on the total weight of the cleaning solution.

According to certain example cleaning solutions in concentrated form, before dilution to a point of use composition, a total amount of one or particle removal agents in the cleaning solution concentrate can be at least about 7 percent, such as at least about 10 weight percent based on the total weight of the cleaning solution, but not more not more than 20 weight percent, preferably not more than 8 weight percent, e.g., not more than 7 weight percent particle removal agent based on the total weight of the cleaning solution.

In addition to the particle removal agent, a cleaning composition as described can preferably include one or more other dissolved chemical ingredients that act as cleaning agents to assist in removing residue from a surface of a substrate, e.g., during a post-CMP cleaning step. The one or more cleaning agents may act by various known cleaning or sequestration mechanisms, such as by dissolving residue that is an organic material, by dispersing solid or particulate residue, or by otherwise interacting with or isolating a residue that is present at a surface of a substrate after a CMP step, or that is present in a cleaning solution used to clean the substrate during a post-CMP cleaning step.

Examples of useful organic solvents are known for use in post-CMP cleaning solutions and methods. Example solvents can be polar organic solvents, alcohols, glycols, and amines, among others. Non-limiting examples include lower molecular weight alcohols such as $C_1$ to $C_4$ alkyl alcohols, alkylene glycols, ethanolamines (e.g., monoethanol amine), N,N'-dimethylformamide, dimethylsulfoxide, N-methylpyrrolidone, N-ethylpyrrolidone, etc.

Illustrative examples of organic amines include species having the general formula $NR^1R^2R^3$, wherein $R^1$, $R^2$ and $R^3$ may be the same as or different from one another and are selected from the group consisting of hydrogen, straight-chained or branched $C_1$-$C_6$ alkyl (e.g., methyl, ethyl, propyl, butyl, pentyl, and hexyl), straight-chained or branched $C_1$-$C_6$ alcohol (e.g., methanol, ethanol, propanol, butanol, pentanol, and hexanol), and straight chained or branched ethers having the formula $R^4$—O—$R^5$, where $R^4$ and $R^5$ may be the same as or different from one another and are selected from the group consisting of $C_1$-$C_6$ alkyls as defined above. When the amine includes the ether component, the amine may be considered an alkoxyamine. Most preferably, at least one of $R^1$, $R^2$ and $R^3$ is a straight-chained or branched $C_1$-$C_6$ alcohol. Examples include, without limitation, alkanolamines such as alkanolamines such as aminoethylethanolamine, N-methylaminoethanol, aminoethoxyethanol, dimethylaminoethoxyethanol, diethanolamine, N-methyldiethanolamine, monoethanolamine, triethanolamine, 1-amino-2-propanol, 3-amino-1-propanol, diisopropylamine, isopropylamine, 2-amino-1-butanol, isobutanolamine, diisopropanolamine, tris(hydroxymethyl) aminomethane (TRIS), tris(hydroxyethyl)aminomethane, other $C_1$-$C_8$ alkanolamines, and combinations thereof; amines such as triethylenediamine, ethylenediamine, hexamethylenediamine, diethylenetriamine, triethylamine, trimethylamine, and combinations thereof; diglycolamine; morpholine; and combinations of amines and alkanolamines. Preferably, the organic amine comprises monoethanolamine.

Generally, organic solvent can be included in a cleaning solution in an amount that will be useful to be effective in a manner described herein for an organic solvent as a cleaning agent, e.g., by dissolving an organic residue. Particular types and amounts of organic solvent that are included in a given cleaning solution can be selected based on factors that include the type of substrate being cleaned, the types and amounts of residue present at the substrate surface, other ingredients in the cleaning solution, and the conditions (timing, temperature, etc.) used in a post-CMP cleaning process.

According to certain example cleaning solutions, a total amount of one or more organic solvents in a cleaning solution at a point of use (during a post-CMP cleaning process) can be below about 1 percent by weight based on total weight of the cleaning solution, more preferably below about 0.33 weight percent, most preferably not more than 0.13 weight percent, e.g., not more than 0.067 weight percent, or not more than 0.033 weight percent based on the total weight of the cleaning solution. Preferably, if present, an amount of organic solvent can be at least 0.0003 weight percent, more preferably at least 0.001 weight percent, e.g., at least 0.015 or 0.025 weight percent based on the total weight of the cleaning solution.

According to certain example cleaning solutions in concentrated form, before dilution to a point of use composition, a total amount of one or more organic solvents in the cleaning solution concentrate can be not more than 20 weight percent, more preferably not more than 10 weight percent, most preferably not more than 7 weight percent, e.g., not more than 2 weight percent, or not more than 1 weight percent based on the total weight of the cleaning solution. Preferably, if present, a useful amount may be at least 0.005 weight percent, more preferably at least 0.01 weight percent, such as at least 0.05 weight percent or at least 0.2 or 0.35 weight percent based on the total weight of the cleaning solution.

The cleaning solution can optionally contain at least one chelating agent. In general, a chelating agent used in a post-CMP cleaning composition is a chemical compound that forms a complex molecule, typically with a metal ion, often an iron ion, to inactivate the ion within the cleaning solution and prevent chemical reaction or activity by the ion. Various chelating agents are known for use in post-CMP cleaning compositions and can be used in a cleaning composition and method of the present description. Certain specific examples include acid-containing organic molecules, especially carboxylic acid-containing organic molecules such as linear or branched $C_1$-$C_6$ carboxylic acid compounds that include phthalic acid, succinic acid, citric acid, tartaric acid, malic acid, gluconic acid, aspartic acid, or a combination thereof, as well as, glycine, amino acids and the like. Citric acid can be a preferred chelating agent for chelating iron ions (e.g., $Fe^{+2}$, $Fe^{+3}$). Sugar alcohols such as: arabitol, erythritol, glycerol, hydrogenated starch hydrolysates (HSH), isomalt, lactitol, maltitol, mannitol, sorbitol, and xylitol are also preferred chelating reagents for metal ions.

Other metal chelating reagents contemplated herein include, but are not limited to, acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, sorbitol, succinic acid, tartaric acid, terephthalic acid, trimellitic acid, trimesic acid, tyrosine, valine, xylitol, ethylenediamine, oxalic acid, tannic acid, picolinic acid, 1,3-cyclopentanedione, catechol, pyrogallol, resorcinol, hydroquinone, cyanuric acid, barbituric acid, 1,2-dimethylbarbituric acid, pyruvic acid, propanethiol, benzohydroxamic acids, tetraethylenepentamine (TEPA), 4-(2-hydroxyethyl)morpholine (HEM), N-aminoethylpiperazine (N-AEP), ethylenediaminetetraacetic acid (EDTA), 1,2-cyclohexanediamine-N,N,N',N'-tetraacetic acid (CDTA), N-(hydroxyethyl)-ethylenediaminetriacetic acid (HEdTA), iminodiacetic acid (IDA), 2-(hydroxyethyl)iminodiacetic acid (HIDA), nitrilotriacetic acid, amino tris(methylene phosphoric acid), hydroxyethylidine diphosphonic acid, ethylenediamino tetrakis (methylene phosphoric acid), ethylenediamino pentakis(methylene phosphoric acid), thiourea, 1,1,3,3-tetramethylurea, urea, urea derivatives, glycine, cysteine, glutamic acid, isoleucine, methionine, piperadine, N-(2-aminoethyl) piperadine, pyrrolidine, threonine, tryptophan, salicylic acid, dipicolinic acid, p-toluenesulfonic acid, 5-sulfosalicylic acid, and combinations thereof.

Other examples of useful chelating agents include carboxylic acid group-containing oligomers and polymers derived from monomers that may include one or more of acrylic acid, methacrylic acid, maleic acid, succinic acid, aspartic acid, 2-acrylamido-2-methyl-1-propanesulfonic, acrylamide, phosphonate methacrylamidopropyl trimethylammonium chloride, allyl halide, or a combination thereof. Polyacrylic acid can be a preferred chelating agent for chelating silica nitride (SiN). Still other examples include: propane-1,2,3-tricarboxylic acid, butane-1,2,3,4-tetracarboxylic acid, pentane-1,2,3,4,5-pentacarboxylic acid, trimellitic acid, trimesinic acid, pyromellitic acid, mellitic acid, and combinations of these.

Generally, a chelating agent can be included in a cleaning solution in an amount useful to be effective in a manner described herein for a chelating agent. Particular types and amounts of chelating agent that are included in a given cleaning solution can be selected based on factors that include the type of substrate being cleaned, the type of residue present at the substrate surface, other ingredients in the cleaning solution, and the conditions of a post-CMP cleaning process.

According to certain example cleaning solutions, a total amount of one or more chelating agents in a cleaning solution at a point of use (during a post-CMP cleaning process) can be up to about 5 weight percent, such as up to about 2 weight percent, most preferably up to about 1 weight percent. Preferably, if present, an amount can be at least 0.0005 weight percent, more preferably at least 0.001 weight percent, such as at least 0.007 weight percent based on the total weight of the cleaning solution.

According to certain example cleaning solutions in concentrated form, before dilution to a point of use composition, a total amount of one or more chelating agents in the cleaning solution concentrate can be not more not more than 20 weight percent, more preferably not more than 13 weight percent, most preferably not more than 10 or 7 weight percent, e.g., not more than 3 weight percent, or not more than 1.5 weight percent based on the total weight of the cleaning solution. Preferably, the amount can be at least 0.008 weight percent, more preferably at least 0.015 weight percent, such as at least 0.1 weight percent or at least 0.3 weight percent based on the total weight of the cleaning solution.

A cleaning solution may optionally contain other ingredients or adjuvants to improve the cleaning effect or efficiency of a post-CMP cleaning step using the cleaning solution. Optionally, for example, a cleaning solution may include a pH adjusting agent or buffering system to control pH of a cleaning solution concentrate or a point of use composition. Examples of suitable pH adjusting agents include organic and inorganic acids effective to reduce pH, such as nitric acid, sulfuric acid, phosphoric acid, phthalic acid, citric acid, adipic acid, oxalic acid, methanesulfonic acid, hydrochloric acid, malonic acid, maleic acid, among others. Other option ingredients include a surfactant (any type) or a biocide.

According to the present description, a post-CMP cleaning method as described, which incorporates a cleaning solution that contains particle removal agent as described, can be useful to clean a substrate after a CMP step, preferably and advantageously in a manner that results in a reduced occurrence of brushmarks present at a surface of a substrate at the end of the post-CMP cleaning step, relative to a comparable cleaning method that is performed in an identical fashion (using the same cleaning apparatus, brushes, amount of cleaning solution, cleaning time, cleaning temperature, etc.), on an identical substrate (with comparable residue), except that the cleaning solution of the comparable cleaning method does not contain particle removal agent as described herein (including an amount thereof). According to embodiments of post-CMP substrate cleaning methods of the present description, the use a cleaning solution as described, which includes particle removal agent (e.g., in an amount as described), can result in a reduced presence of brushmarks (especially linear brushmarks) on a surface of a substrate at an end of a post-CMP cleaning process (e.g., by at least 50, 75, 90, or 95, or 99 percent) relative to an otherwise identical post-CMP cleaning method on an identical substrate (with identical or comparable residue), that uses a cleaning solution that is otherwise identical but does not contain the particle removal agent.

Also according to the present description, a post-CMP cleaning method as described, which incorporates a cleaning solution as described, containing particle removal agent as described (including an amount as described), can result in a reduced amount of abrasive particles present at a surface of a polymeric cleaning brush during or at an end of the cleaning step, relative to a comparable cleaning method that is performed in an identical fashion (using the same cleaning apparatus, brushes, amount of cleaning solution, cleaning time, cleaning temperature, etc.), on an identical substrate (with comparable residue) except that the cleaning solution of the comparable cleaning method does not contain the particle removal agent (e.g., in an amount as described herein). According to embodiments of post-CMP substrate cleaning methods of the present description, that use a cleaning solution as described, the presence of abrasive particles present at (e.g., attracted by hydrogen bonding) a surface of a polymeric cleaning brush as described, during or at an end of a post-CMP cleaning process, can be reduced (e.g., by at least 50, 75, 90, or 95, or 99 percent) relative to an otherwise identical post-CMP cleaning method on an identical substrate, that uses a cleaning solution that is otherwise identical but does not contain the particle removal agent.

Example cleaning solutions are useful for removing residue present at a substrate surface, or to reduce the presence of (i.e., remove) or reduce the accumulation of abrasive particles at a polymeric surface of a cleaning brush. In processing a substrate or a brush for either of these purposes, the cleaning solution is not one that is intended to or is used (as described herein) to remove a material that makes up the surface layer of the substrate. Consequently, a cleaning solution as described does not require and can preferably exclude any substantial amount of chemical material or abrasive material that is useful and intended to have the effect of removing material from a surface of a substrate, these ingredients including abrasive particles, oxidizer, surfactant, catalyst, etc., of the type that may typically be present in a CMP slurry that is designed to be used in a CMP process to remove material from a substrate surface.

A cleaning solution as described (in an original form, before being used in method as described herein) can exclude abrasive particles of a type that may be present in a CMP processing step. These are solid particles (e.g., nanoparticles) present in a CMP slurry for use to mechanically remove material from a surface of a substrate during a CMP processing step. Examples include silica particles, ceria particles, zirconia particles, alumina particles, as well as other metal and metal oxide abrasive particles, etc., that exist in solid (non-dissolved) form in a slurry. Cleaning solutions of the present description (in an original form, before being used in cleaning step) can contain not more than 1, 0.1, 0.01, 0.001, 0.0001 weight percent of solid abrasive particles based on a total weight of the cleaning solution. These amounts are representative of cleaning solutions at a point of use, and for concentrate compositions.

Similarly, preferred cleaning solutions as described do not require and can optionally exclude chemical materials that function by chemical interaction with a material that makes up a surface layer of a CMP substrate, or with another material of a slurry, to facilitate effective removal of the surface layer material from a substrate surface. Examples of such chemical materials include surfactant, catalyst (e.g., metal-ion catalysts, especially iron-ion catalysts), and oxidizer, among others. Example cleaning solutions may contain not more than 1, 0.1, 0.01, 0.001, or 0.0001 weight percent of any one or combination of surfactant, catalyst, or oxidizer, based on total weight cleaning solution. These amounts are representative of cleaning solutions at a point of use, and for concentrate compositions.

For purposes of excluding catalyst, oxidizer, and surfactant as ingredients from a cleaning solution as described, a "surfactant" is an organic compound that lowers the surface tension (or interfacial tension) between two liquids or between a liquid and a solid, typically an organic amphiphilic compound that contains a hydrophobic group (e.g., a hydrocarbon (e.g., alkyl) "tail") and a hydrophilic group. A surfactant may be of any HLB (hydrophilic-lipophilic balance) value, and may be charged, uncharged, etc., examples of many varieties of surfactants being well known in the chemical and CMP arts.

A "catalyst" is a material that can be effective to provide a metal ion to a solution (e.g., a liquid carrier of a CMP slurry) that, especially in the presence of an oxidizing agent, is capable of reversible oxidation and reduction in the presence of a metal material at a surface layer of a CMP substrate, especially a metal material that is being removed from the substrate surface during a CMP process step that uses the slurry, and wherein the metal ion of the catalyst facilitates that removal. Examples of metal-ion-type catalysts are well known in the CMP arts and can supply a metal ion to the slurry, such as an ion of iron, cobalt, copper, europium, manganese, tungsten, molybdenum, rhenium, or iridium. Examples of such an iron-ion catalysts may be soluble in a liquid carrier and may include ferric (iron III) or ferrous (iron II) compounds such as iron nitrate, iron sulfate, iron halides (including fluorides, chlorides, bromides, and iodides, as well as perchlorates, perbromates and periodates), and organic iron compounds such as iron acetates, acetylacetonates, citrates, gluconates, malonates, oxalates, phthalates, and succinates, and mixtures thereof.

An oxidizer (a.k.a., oxidizing agents) is a compound that is or includes an inorganic or organic per-compound. A per-compound can be understood to be a compound that contains at least one peroxy group (—O—O—), or a compound that contains an element in a highest oxidation state. Examples of compounds that contain at least one peroxy group include hydrogen peroxide and its adducts such as urea hydrogen peroxide and percarbonates, organic peroxides such as benzoyl peroxide, peracetic acid, and di-t-butyl peroxide, monopersulfates ($SO_5^=$), dipersulfates ($S_2O_8^=$), and sodium peroxide. Examples of compounds that contain an element in a highest oxidation state include periodic acid, periodate salts, perbromic acid, perbromate salts, perchloric acid, perchlorate salts, perboric acid, and perborate salts and permanganates. An often-preferred oxidizing agent for CMP slurries is hydrogen peroxide.

At a point of use, a cleaning composition as described and in a concentrated form can be diluted to form a cleaning solution for use in a post-CMP cleaning step. The concentrate can include chemical ingredients as described in amounts that, upon dilution, will provide a point of use composition having desired concentrations of each ingredient. The concentrate can have a pH that will be below a pH of a use composition, e.g., a pH of a concentrate may be below 2.5 or below 2. The amount of water added to the concentrate to form the use composition, i.e., the dilution rate, can be as desired. Example concentrates may be diluted by a factor of 10, 50, 100, or 200, e.g., by combining a volume of the concentrate with a volume of water that is 10, 50, 100, or 200 times the volume of the concentrate.

According to various examples of methods for using a cleaning solution as described, a microelectronic device substrate can be cleaned in a post-CMP cleaning step, e.g., using a post-CMP cleaning apparatus, to remove residue from a surface of the substrate, including abrasive particle residue. The substrate may be a microelectronic device substrate, generally a flat wafer that can include a base, with materials that have been selectively deposited onto and selectively removed from the substrate to produce layers of microelectronic features, including a surface layer. The surface layer may be made of such deposited materials, including one or more metal (e.g., copper, tungsten, silver, cobalt, nickel, etc.), insulating or dielectric material (e.g., TEOS, silicon nitride), and semiconducting material. At the surface, but not part of a deposited material that makes up the surface layer of the substrate, residue as described may be present, including abrasive particles that were used in the CMP step.

A specific example of a substrate, with residue, is a post-CMP microelectronic device substrate that contains meatal features at a surface (e.g., tungsten, copper, or cobalt as a liner or interconnect (e.g. plug) structure), and one or more non-metal materials such as a dielectric material or a barrier layer (e.g., TEOS, silicon nitride, among others). The substrate contains residue at a surface, such as abrasive particles. The abrasive particles may be of any useful type, e.g., alumina, silica, ceria, zirconia, or a related oxide. The abrasive particles will generally be of a type that is useful to process the specific type of wafer and materials at the surface of the wafer. For example, a substrate that includes tungsten features and a dielectric material at a surface may be previously processed by a CMP step that includes silica abrasive particles.

According to a cleaning step, a CMP substrate having residue at a surface is contacted with a polymeric cleaning brush and cleaning solution as described is dispensed onto the cleaning brush and substrate surfaces. Relative motion between the brush and the substrate surface, with a desired amount of pressure, is provided. The post-CMP cleaning step is effective to reduce the amount of residue, including abrasive particles present at the substrate surface after the CMP step.

Examples

Examples illustrating concepts of the invention described herein, as well as comparative examples are listed in Table 1:

TABLE 1

| Formulation components, % | Citric acid | Mono-ethanol-amine | Poly(acrylic acid) | Sorbitol | Glycerol | Xylitol | Arabitol | Fructose | Mannitol | Dextran | Other additives | # Particle Defects on PETEOS (normalized) |
|---|---|---|---|---|---|---|---|---|---|---|---|---|
| Control, pH 6 | 3 | 4 | 0.05 | 0 | 0 | 0 | 0 | 0 | 0 | 0 | | 1 |
| Comparative Sample 1, pH = 2 | 3 | 4 | 0.05 | 0 | 0 | 0 | 0 | 0 | 0 | 0 | | 2.8 |
| Sample 1, pH = 2 | 3 | 4 | 0.05 | 6 | | | | | | | | 0.54 |
| Sample 2, pH = 2 | 3 | 4 | 0.05 | | 3 | | | | | | | 0.65 |
| Sample 3, pH = 2 | 3 | 4 | 0.05 | 6 | 3 | | | | | | | 0.22 |
| Sample 4, pH = 2 | 3 | 4 | 0.05 | | | 6 | | | | | | 0.35 |
| Sample 5, pH = 2 | 3 | 4 | 0.05 | | | | 6 | | | | | 0.49 |
| Sample 6, pH = 2 | 3 | 4 | 0.05 | | | | | 6 | | | | 0.31 |
| Sample 7, pH = 2 | 3 | 4 | 0.05 | | | | | | 6 | | | 0.28 |
| Sample 8, pH = 2 | 3 | 4 | 0.05 | | | | | | | 6 | | 0.25 |
| Comparative Example Cleaner 1, pH = 2 | 3 | 4 | 0.05 | 0 | 0 | 0 | 0 | 0 | 0 | 0 | 3 | 2.6 |
| Comparative Example Cleaner 2, pH = 2 | 3 | 0 | 0.05 | 0 | 0 | 0 | 0 | 0 | 0 | 0 | 5 | 5.8 |
| Comparative Example Cleaner 3, pH = 2 | 3 | 4 | 0.05 | 0 | 0 | 0 | 0 | 0 | 0 | 0 | 6 | 3.2 |

PETEOS wafers were polished with a colloidal silica based CMP slurry on a IC 1010 pad and cleaned with 5 formulations of different pH's: Control, pH 6, Cleaners 1, 2 and 3 (pH=2) and a commodity, dAmmonia, pH 10. Polishing was done on an AMAT Reflexion LK polishing tool, and the defect inspection was done on a KLAT SP-3 tool, ≥0.I/O.065/0.060 μm defect size and a KLAT eDR-7100 defect review tool (microscope, SEM, EDX).

Cleaning was done with Entegris brushes (PVP1ARXR1), with no megasonic step.

FIG. 1 shows defectivity data on PETEOS wafers cleaned at pH<6 and pH>6, with brush marks detected only when using Cleaners 1, 2 and 3, at pH~2.

FIG. 2 illustrates the mechanism of brush imprint formation based on silica-brush hydrogen bonding at low pH.

Figure 3:
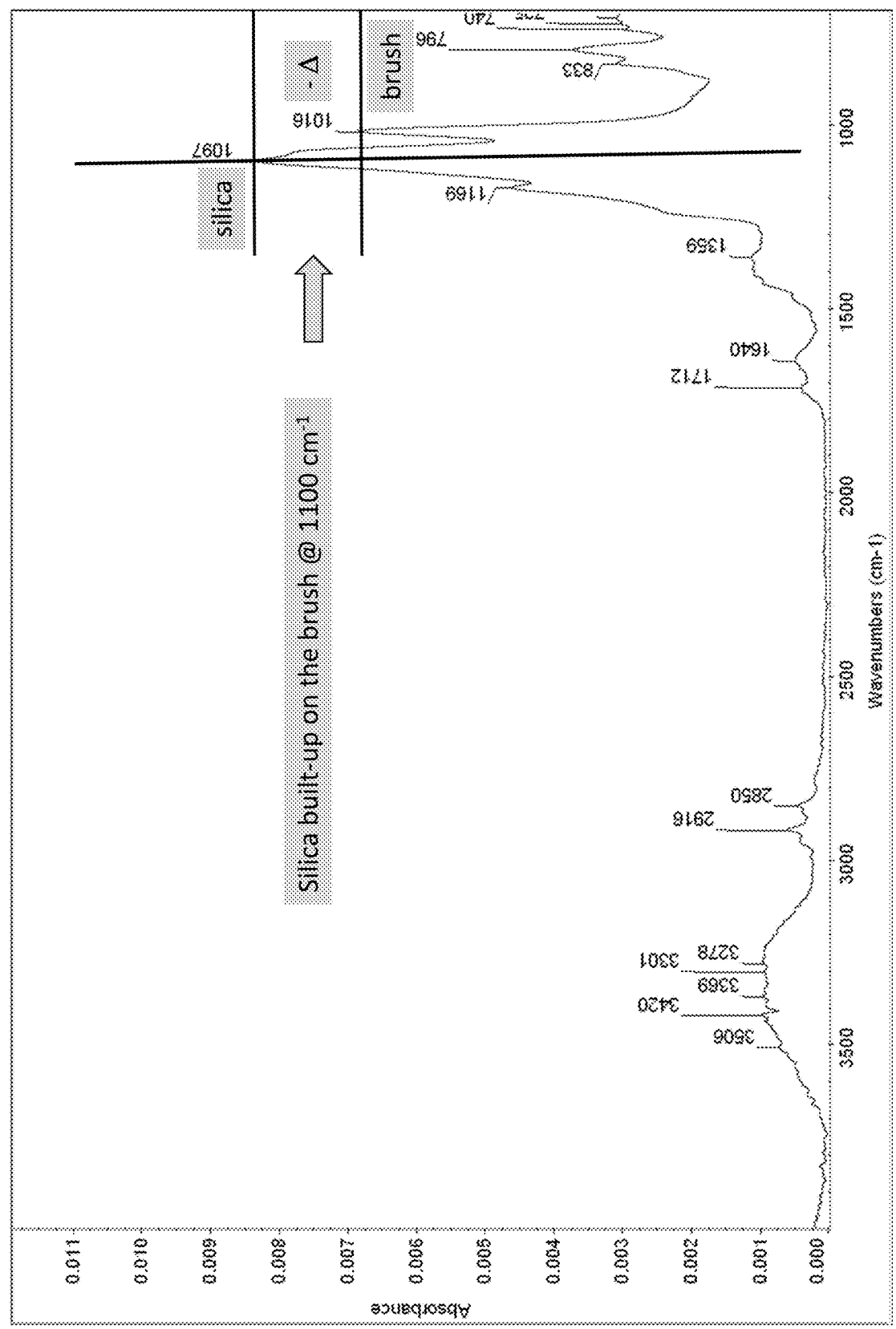
FIG. 3 shows FTIR spectrum data of a brush having silica at a surface, as described.

The brush loading with silica can be also detected using FTIR spectroscopy, where clearly the silica Si—O—Si peak, around 1100 $cm^{-1}$ can be distinguished from the brush characteristic peak, C—O—C, at around 1016 $cm^{-1}$ (FIG. 3).

A list with H-bonding silica brush cleaning additives used in this experiment is presented in Table 2:

TABLE 2

| Formulation | Additive |
| --- | --- |
| 1 | glycerine + K2S2O5 |
| 4 | glycerine + formic acid |
| 8 | glycerine + 3 MPA |
| 13 | glycerine + urea |
| 15 | Glycerine + DMSO |
| 16 | Glycerine + oxalic acid |
| 18 | maleic acid |
| 19 | glycolic acid |
| 20 | sorbitol |
| 21 | sulfolane |

Figure 4:
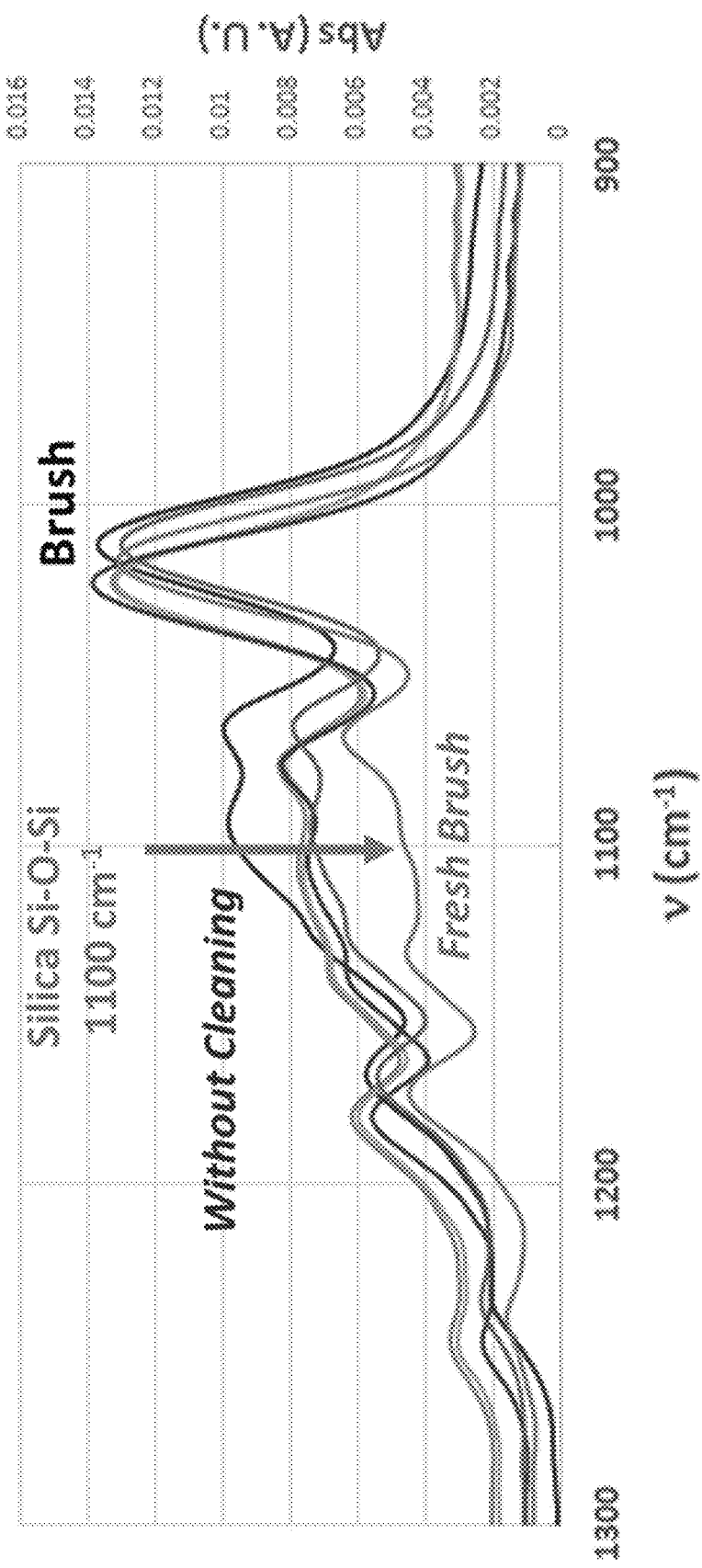
FIG. 4 shows FTIR spectra data of a brush having silica at a surface, with different cleaning materials.
Figure 5:
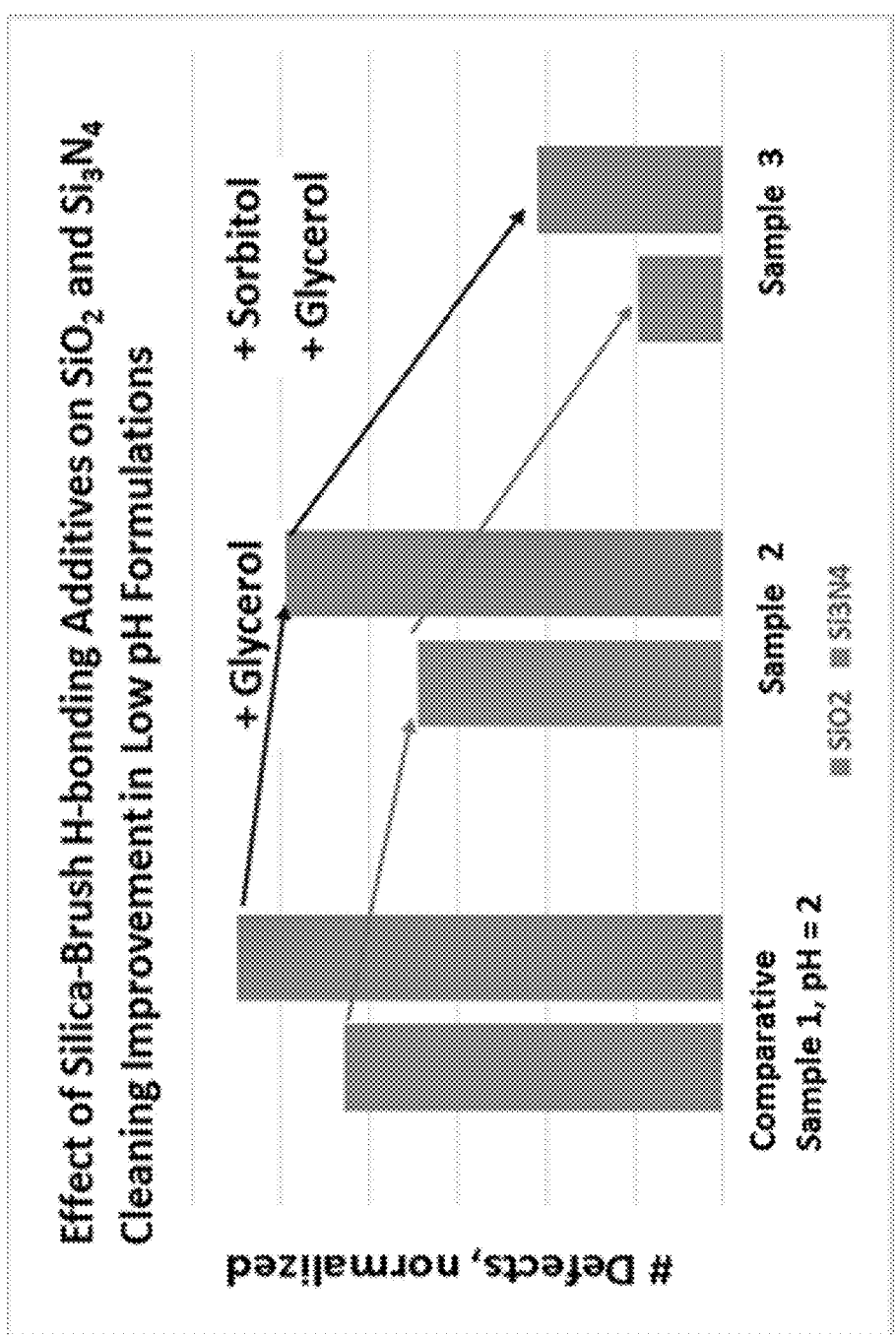
FIGS. 5 and 6 show data derived from the use of various cleaning solutions as described.
Figure 6:
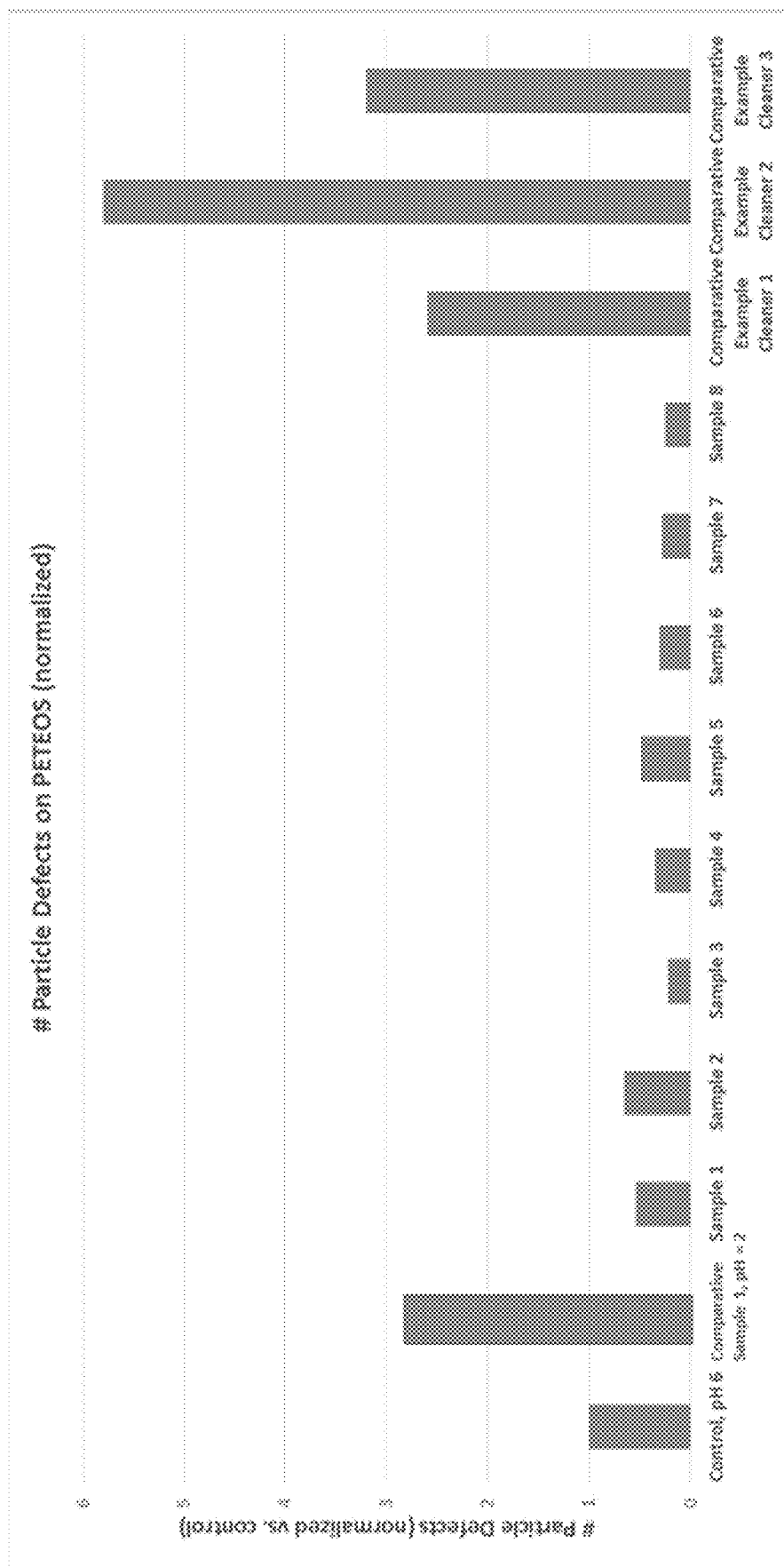

FTIR spectra of silica contaminated brushes cleaned with some of pH 2 formulations containing these additives are presented in FIG. 4:

FIGS. 5 and 6 illustrate defectivity on PETEOS wafers as direct comparison of the Samples 1-8 (Table 1) (current invention, using enriched silica-H-bonding additives or brush-H-bonding additives) vs. comparative examples without these additives.

We claim:

1. A method of removing abrasive particles from a post-chemical-mechanical-processing (post-CMP) cleaning brush, the method comprising:
providing a post-CMP cleaning brush having a polymeric surface and having abrasive particle residue at the polymeric surface, the polymeric surface including polymer made from monomer that comprises a vinyl alcohol monomer and the abrasive particle residue comprising abrasive particles having hydrogen bonding groups at surfaces of the particles,
providing a cleaning solution having a pH in a range from 1 to 4, the cleaning solution comprising:
cleaning agent and
particle removal agent, and
removing the abrasive particle residue from the polymeric surface by contacting the polymeric surface with the cleaning solution.

2. The method of claim 1, wherein the cleaning solution has a pH in a range from about 2 to 3.5.

3. The method of claim 1, wherein the particle removal agent includes one or more hydrogen bonding groups.

4. The method of claim 3, wherein the hydrogen bonding groups are: a carboxylic acid, an amino group, an alcohol, a phosphine, phosphate, phosphonate, an alkanolamine, a carbamide, a urea, urethane, ester, a betaine, a silanol group or a sulfur-containing group.

5. The method of claim 3, wherein the particle removal agent is: a carboxylic acid compound, an amino acid compound, a polyol with at least 3 hydroxy groups, a polyalkyleneoxide homo- or copolymer, an amine-containing homopolymer or copolymer.

6. The method of claim 5, wherein the particle removal agent is: lactic acid, maleic acid, urea, glycolic acid, sorbitol, borax (i.e., sodium borate), proline, a betaine, glycine, histidine, TRIS (tris(hydroxymethyl) aminomethane), dimethyl sulfoxide, sulfolane, glycerol, sorbitol, xylitol, fructose, mannitol, arabinol, and dextran or a combination thereof.

7. The method of claim 1, wherein the abrasive particles exhibit a positive charge at the pH of the cleaning solution.

8. The method of claim 1, wherein the hydrogen bonding group is a silanol (SiOH) group.

9. The method of claim 1, wherein the abrasive particles are selected from: silica particles, ceria particles, ceria oxide particles, alumina particles, titanium dioxide, zirconia, diamonds or silicon carbide particles or a combination thereof.

10. The method of claim 1, wherein the cleaning agent comprises one or more of a chelating agent and an organic solvent.

11. The method of claim 1, wherein the cleaning agent comprises citric acid, monoethanol amine, polyacrylic acid, or a combination thereof.

* * * * *